(12) United States Patent
Yang

(10) Patent No.: US 12,181,576 B2
(45) Date of Patent: Dec. 31, 2024

(54) TIME-OF-FLIGHT BASED DISTANCE MEASURING METHOD AND DISTANCE MEASURING SYSTEM

(71) Applicant: SHENZHEN GOODIX TECHNOLOGY CO., LTD., Guangdong (CN)

(72) Inventor: Meng-Ta Yang, Guangdong (CN)

(73) Assignee: SHENZHEN GOODIX TECHNOLOGY CO., LTD., Guangdong (CN)

( * ) Notice: Subject to any disclaimer, the term of this patent is extended or adjusted under 35 U.S.C. 154(b) by 1055 days.

(21) Appl. No.: 17/028,764

(22) Filed: Sep. 22, 2020

(65) Prior Publication Data

US 2021/0018623 A1 Jan. 21, 2021

Related U.S. Application Data

(63) Continuation of application No. PCT/CN2018/103631, filed on Aug. 31, 2018.

(51) Int. Cl.
*G01S 17/10* (2020.01)
*G01S 7/481* (2006.01)
*G01S 7/484* (2006.01)

(52) U.S. Cl.
CPC ............ *G01S 17/10* (2013.01); *G01S 7/4816* (2013.01); *G01S 7/484* (2013.01)

(58) Field of Classification Search
None
See application file for complete search history.

(56) References Cited

U.S. PATENT DOCUMENTS

2016/0259038 A1 9/2016 Retterath et al.
2017/0293021 A1 10/2017 Franzreb et al.
2018/0128921 A1 5/2018 Mattioli Della Rocca et al.

FOREIGN PATENT DOCUMENTS

CN 101946189 A 1/2011
CN 102262228 A 11/2011
(Continued)

OTHER PUBLICATIONS

Notice of Allowance dated Aug. 1, 2023 from the China National Intellectual Property Administration from corresponding China application.

(Continued)

*Primary Examiner* — Isam A Alsomiri
*Assistant Examiner* — Sanjida Naser
(74) *Attorney, Agent, or Firm* — WPAT, P.C.; Anthony King

(57) ABSTRACT

A time-of-flight based distance measuring method and a time-of-flight based distance measuring system are provided. The distance measuring method includes: sending N consecutive pulses from a transmitter side intermittently, N being a positive integer greater than one, wherein the N consecutive pulses are reflected by a target object, and a reflection signal is generated accordingly; during arrival of the reflected signal at a receiver side, sampling the reflected signal multiple times according to a predetermined sampling interval within a predetermined sampling duration and accordingly generating a sampling result; detecting time of flight of a single pulse of the N consecutive pulses traveling from the transmitter side to the receiver side according to the sampling result; and measuring a distance between the target object and a reference position according to the time of flight. The distance measuring method maintains good mea- (Continued)

surement quality, measures the distance rapidly, and consumes low power.

18 Claims, 9 Drawing Sheets

(56) References Cited

FOREIGN PATENT DOCUMENTS

| CN | 102597801 | A | | 7/2012 | |
|---|---|---|---|---|---|
| CN | 102662176 | A | | 9/2012 | |
| CN | 103616696 | A | | 3/2014 | |
| CN | 105093206 | A | | 11/2015 | |
| CN | 105866783 | A | | 8/2016 | |
| CN | 107690565 | A | | 2/2018 | |
| CN | 107861116 | A | | 3/2018 | |
| EP | 2799906 | A1 | * | 11/2014 | ............. G01S 17/89 |
| IN | 102901970 | A | | 1/2013 | |
| IN | 103926590 | A | | 7/2014 | |
| JP | H06174826 | A | | 6/1994 | |
| JP | H06242240 | A | | 9/1994 | |
| JP | H0886875 | A | | 4/1996 | |
| JP | H08220214 | A | | 8/1996 | |
| KR | 20160092137 | A | | 8/2016 | |
| TW | 428081 | B | | 4/2001 | |
| WO | WO 2020/042166 | A1 | | 3/2020 | |

OTHER PUBLICATIONS

English abstract translation of CN102597801A.
English abstract translation of CN102662176A.
English abstract translation of CN105093206A.
English abstract translation of CN107861116A.
English abstract translation of JPH06174826A.
English abstract translation of JPH06242240A.
English abstract translation of JPH08220214A.
English abstract translation of KR20160092137A.
English abstract translation of CN102262228A, CN105866783A, CN107690565 and TW428081B.
English Abstract of JPH0886875A.
English Abstract Translation of Foreign Reference CN101946189A.
English Abstract Translation of Foreign Reference CN102901970A.
English Abstract Translation of Foreign Reference CN103616696A.
English Abstract Translation of Foreign Reference CN103926590A.
International Searching Authority (ISA) Form 210—International Search Report of PCT/CN2018/103631.
International Searching Authority (ISA) Form 220—Notification of Transmittal of the International Search Report of PCT/CN2018/103631.
International Searching Authority (ISA) Form 237—Written Opinion of PCT/CN2018/103631.
As-filed PCT Request of PCT/CN2018/103631.
As-filed PCT Application of PCT/CN2018/103631.
Notification of Receipt of Search Copy in Chinese (Form PCT/ISA/202) of PCT/CN2018/103631.
Notification of Publication (Form PCT/IB/311) of PCT/CN2018/103631 noting that PCT/CN2018/103631 has published as WO 2020/042166.

* cited by examiner

TIME-OF-FLIGHT BASED DISTANCE MEASURING METHOD AND DISTANCE MEASURING SYSTEM

CROSS REFERENCE TO RELATED APPLICATIONS

The present disclosure is a continuation of international application No. PCT/CN2018/103631, filed on Aug. 31, 2018, which is hereby incorporated by reference in its entirety.

TECHNICAL FIELD

The present disclosure relates to time-of-flight sensing techniques and, more particularly, to a distance measuring method which generates a plurality of consecutive pulses intermittently to detect time of flight, and a related time-of-flight based distance measuring system.

BACKGROUND

A time-of-flight (ToF) based distance measuring technique usually utilizes continuous-wave (CW) modulation to measure a distance related to a target object. The CW modulation obtains a phase shift of a sinusoidal wave between a transmitter side and a receiver side by continuously sending, toward a target object, a plurality of light signals modulated by the sinusoidal wave, thereby measuring a distance related to the target object. The CW modulation can reduce errors caused by measurement devices or ambient light. However, the CW modulation has to perform sampling and integration operations multiple times, which not only makes the measurement more time consuming but also leads to larger measurement errors. Further, the system power consumption increases because the sinusoidal wave is sent continuously.

Thus, there is a need for a novel ToF based light sensing mechanism, which can precisely and rapidly measure a distance related to a target object and exhibit low power consumption.

SUMMARY

It is a target objective of the present disclosure to provide a distance measuring method which generates a plurality of consecutive pulses intermittently to detect time of flight, and a distance measuring system utilizing the distance measuring method, to thereby solve the problems of high system power consumption and large measurement errors in existing time-of-flight based distance measuring systems.

Some embodiments of the present disclosure provide an exemplary time-of-flight based distance measuring method. The distance measuring method includes: sending N consecutive pulses from a transmitter side intermittently, N being a positive integer greater than one, wherein the N consecutive pulses are reflected by a target object, and a reflection signal is reflected from the target object accordingly; during arrival of the reflected signal at a receiver side, sampling the reflected signal multiple times according to a predetermined sampling interval within a predetermined sampling duration and accordingly generating a sampling result; detecting time of flight of a single pulse of the N consecutive pulses traveling from the transmitter side to the receiver side according to the sampling result; and measuring a distance between the target object and a reference position according to the time of flight.

Some embodiments of the present disclosure provide an exemplary time-of-flight based distance measuring system. The distance measuring system includes a pulse generator unit, a control circuit and a time-of-flight sensor. The control circuit, coupled to the pulse generator unit, is configured to drive the pulse generator unit to send N consecutive pulses intermittently. N is a positive integer greater than one. The N consecutive pulses are reflected by a target object and a reflection signal is reflected from the target object accordingly. The time-of-flight sensor, controlled by the control circuit, is configured to, during arrival of the reflected signal, sample the reflected signal multiple times according to a predetermined sampling interval within a predetermined sampling duration and accordingly generate a sampling result. The time-of-flight is further configured to detect time of flight of a single pulse of the N consecutive pulses according to the sampling result, and measure a distance between the target object and a reference position according to the time of flight.

The proposed ToF based sensing scheme or distance measuring scheme can obtain phase shift information by sending at least two consecutive pulses intermittently and taking one pulse period to perform sampling operations, thereby measuring a distance related to a target object. Thus, the proposed ToF sensing scheme or distance measuring scheme can maintain good measurement quality, measure the distance related to the target object rapidly, and have the advantage of low power consumption.

DESCRIPTION

Certain terms are used throughout the description and following claims to refer to particular components. As one skilled in the art will appreciate, electronic equipment manufacturers may refer to a component by different names. This document does not intend to distinguish between components that differ in name but not function. In the following description and in the claims, the terms "include" and "comprise" are used in an open-ended fashion, and thus should be interpreted to mean "include, but not limited to". Also, the term "couple" and "coupled" are intended to mean either an indirect or direct electrical connection. Accordingly, if a first device is coupled to a second device, that connection may be through a direct electrical connection, or through an indirect electrical connection via other devices and connections.

The proposed ToF distance measuring scheme can send at least two consecutive pulses from a transmitter side, and sample a corresponding reflected signal (generated in response to the at least two consecutive pulses reflected by a target object) multiple times within a predetermined sampling duration (e.g. a period of time equal to a pulse period of one pulse) during arrival of the reflected signal, thereby realizing a sensing mechanism which simulates CW modulation based on pulsed modulation. Further description is provided below.

Figure 1:
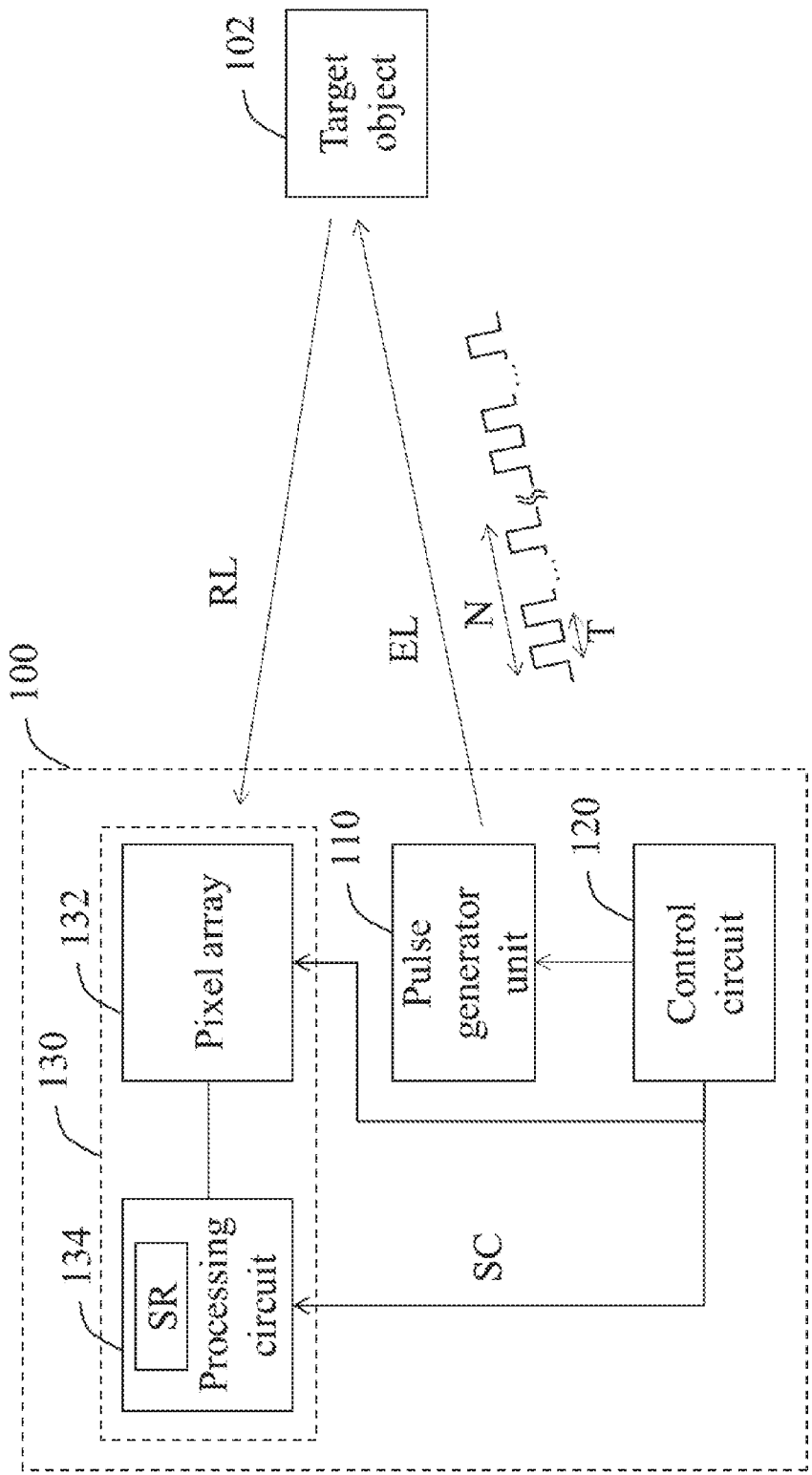
FIG. 1 is a block diagram illustrating an exemplary time-of-flight based distance measuring system in accordance with some embodiments of the present disclosure.

FIG. 1 is a block diagram illustrating an exemplary time-of-flight (ToF) based distance measuring system in accordance with some embodiments of the present disclosure. The distance measuring system 100 can be configured to detect a distance between a target object 102 and the distance measuring system 100. It is worth noting that the distance between the target object 102 and the distance measuring system 100 is supposed to be longer than or equal to a maximum range of the distance measuring system 100. By way of example but not limitation, the distance measuring system 100 may be implemented as a three-dimensional (3D) imaging system, which utilizes ToF techniques to measure a distance related to a surrounding target object, and accordingly obtain depth of field and 3D image information.

It is worth noting that the distance measuring system 100 can be implemented as various types of ToF based distance measuring systems, such as a ToF based optical distance measuring system, a ToF based laser distance measuring system or other types of ToF based distance measuring systems. For the sake of brevity, the proposed ToF based distance measuring scheme is described with reference to the following embodiments where the distance measuring system 100 is implemented as a ToF based optical distance measuring system. However, those skilled in the art will recognize that the proposed ToF based distance measuring scheme can be employed in any types of ToF based distance measuring systems.

The distance measuring system 100 may include, but is not limited to, a pulse generator unit 110, a control circuit 120 and a time-of-flight (ToF) sensor 130. The pulse generator unit 110 is configured to send N consecutive pulses intermittently, wherein N is a positive integer than one. A duration of a pulse period of each pulse can be labeled T. For example, after sending a series of N consecutive pulses, the pulse generator unit 110 would stop sending pulses for a period of time, which may be much longer or longer than a pulse period of each pulse. The pulse generator unit 110 can be activated again to send another series of N consecutive pulses after the period of time has elapsed.

In the present embodiment, the distance measuring system 100 may be a ToF based optical distance measuring system, wherein the pulse generator unit 110 may be implemented using a light emitting unit and configured to generate a pulsed light signal EL. The pulsed light signal EL may be N consecutive light pulses. In other words, the light emitting unit can intermittently send N consecutive light pulses, which serve as N consecutive pulses generated from the pulse generator unit 110. The light emitting unit may be, but is not limited to, a laser diode (LD), a light emitting diode (LED) or other types of light emitting units capable of generating light pulses. A light pulse generated from the laser diode is coherent light, while a light pulse generated from the light emitting diode is incoherent light.

It is worth noting that the pulse generator unit 110 can be configured to generate other types of pulses, such as acoustic pulses or electromagnetic pulses. For example, in some embodiments where the distance measuring system 100 is implemented as an acoustic distance measuring system, the pulse generator unit 110 may be implemented using an acoustic generator. The acoustic generator is configured to intermittently send N consecutive acoustic pulses such as N ultrasonic pulses, wherein the N acoustic pulses can serve as N consecutive pulses generated from the pulse generator unit 110. As another example, in some embodiments where the distance measuring system 100 is implemented as a laser distance measuring system, the pulse generator unit 110 may be implemented using an electromagnetic wave generator. The electromagnetic wave generator is configured to intermittently send N consecutive electromagnetic pulses, which can serve as N consecutive pulses generated from the pulse generator unit 110.

The control circuit 120, coupled to the pulse genitor unit 110, is configured to drive the pulse generator unit 110 to generate the pulsed light signal EL. For example, the control circuit 120 can be configured to drive the pulse generator unit 110 to send the N consecutive pulses intermittently. The ToF sensor 130, controlled by the control circuit 120, is configured to sample a reflected signal RL, which is reflected from the target object 102 in response to the pulsed light signal EL (i.e. the N consecutive pulses) reflected by the target object 102, to thereby detect the distance between the distance measuring system 100 (or the ToF sensor 130) and the target object 102. In the present embodiment, the ToF sensor 130 can be configured to, during arrival of the reflected signal RL at the ToF sensor 130, sample the reflected signal RL multiple times according to a predetermined sampling interval within a predetermined sampling duration. The predetermined sampling duration may be longer than or equal to a pulse period of a single pulse of the N consecutive pulses, i.e. a length of time T. For example, the ToF sensor 130 can be configured to, within the predetermined sampling duration, sample the reflected signal RL once each time the predetermined sampling interval has elapsed.

In some embodiments, the control circuit 120 can be configured to use a period of time, taken by the pulse generator unit 110 to send a Kth pulse of the N consecutive pulses, as the predetermined sampling duration. K is a positive integer greater than one and less than or equal to N. As a result, during a period of time in which the pulse generator unit 110 sends the Kth pulse of the N consecutive pulses, the ToF sensor 130 may sample the reflected signal RL multiple times according to the predetermined sampling interval. For example, the ToF sensor 130 may sample the reflected signal RL multiple times according to the predetermined sampling interval during a period of time in which the pulse generator unit 110 sends the last one of the N consecutive pulses (K=N). As another example, in some cases where N is greater than or equal to three, the ToF sensor 130 may sample the reflected signal RL multiple times according to the predetermined sampling interval during a period of time in which the pulse generator unit 110 sends the second-to-last one of the N consecutive pulses (K=N−1).

After the sampling of the reflected signal RL is completed, the ToF sensor 130 can be configured to calculate a phase shift between the reflected signal RL and the pulsed light signal EL sent from the pulse generator unit 110 according to a sampling result. For example, the ToF sensor 130 may include, but is not limited to, a pixel array 132 and a processing circuit 134. The pixel array 132 includes a plurality of pixels (not shown in FIG. 1), wherein each of the pixels may include a light sensor (not shown in FIG. 1) configured to generate a photo response signal in response to the reflected signal RL. Each pixel, controlled by the control circuit 120, can be configured to sense the reflected signal RL within the predetermined sampling duration to thereby output the photo response signal. The processing circuit 134 can be configured to generate a sampling result SR by referring to a sample control signal SC to sample respective photo response signals outputted from the pixels once each time the predetermined sampling interval has elapsed. The processing circuit 134 may be further configured to perform signal processing (e.g. mixing operations or discrete Fourier transforms) on the sampling result SR to calculate a phase shift between the reflected signal RL (received by each pixel or a receiver side) and the pulsed light signal EL (sent from the pulse generator unit 110 or a transmitter side), thereby detecting a ToF of the pulsed light signal EL and a distance between the target object 102 and each pixel.

It is worth noting that, in the present embodiment, a distance between the pulse generator unit 110 and each pixel may be much shorter than a distance between the pulse generator unit 110 and the target object 102, and much shorter than a distance between each pixel and the target object 102. As a result, regarding a pixel, a ToF of the pulsed light signal EL traveling from the pulse generator 110 to the target object 102 may be regarded as equal to a ToF of the reflected signal RL traveling from the target object 102 to the pixel. The processing circuit 134 may therefore measure a distance between the target object 102 and the pixel according to the ToF and a velocity of the pulsed light signal EL.

Figure 2:
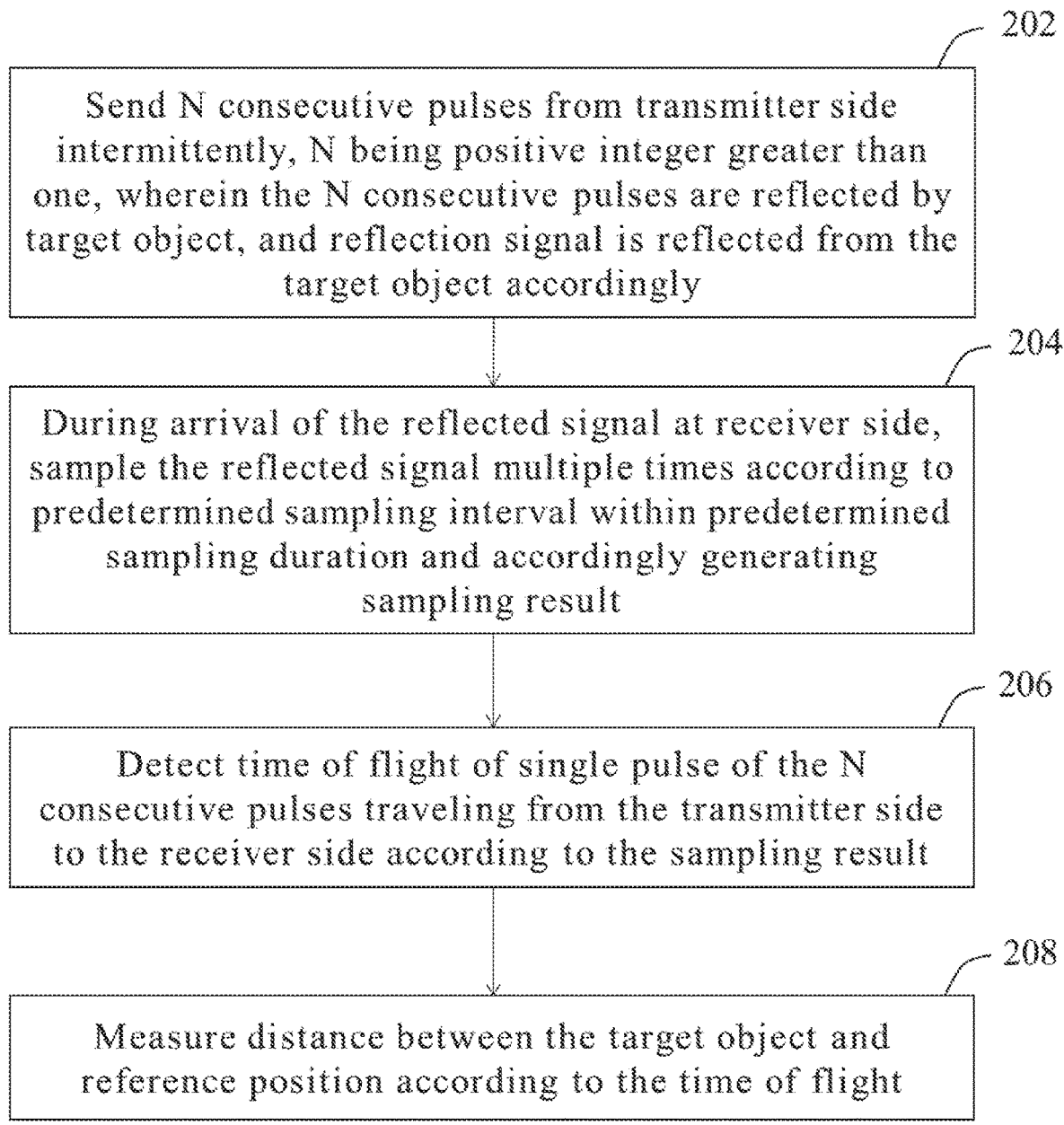
FIG. 2 is a flow chart of an exemplary time-of-flight based distance measuring method in accordance with some embodiments of the present disclosure.

A ToF distance measuring method employed in the distance measuring system 100 may be summarized in FIG. 2. FIG. 2 is a flow chart of an exemplary ToF based distance measuring method in accordance with some embodiments of the present disclosure. The distance measuring method shown in FIG. 2 may be employed in various types of ToF based distance measuring systems or various types of ToF based systems, such a 3D imaging system. For illustrative purposes, the distance measuring method shown in FIG. 2 is described below with reference to the distance measuring system 100 shown in FIG. 1. However, the distance measuring method shown in FIG. 2 can be employed in other ToF based systems without departing from the scope of the present disclosure. The distance measuring method shown in FIG. 2 may be summarized below.

Step 202: Send N consecutive pulses from a transmitter side intermittently. N is a positive integer greater than one. The N consecutive pulses are reflected by a target object, and a reflection signal is reflected from the target object accordingly. For example, the control circuit 120 may control the pulse generator unit 110 to intermittently send N consecutive pulses such as the pulsed light signal EL. After the pulse generator unit 110 sends a series of N consecutive pulses, the control circuit 120 may control the pulse generator unit 110 to stop sending pulses until a period of time has elapsed. When the period of time has elapsed, the pulse generator unit 110 can be activated again by the control circuit 120 to send a next series of N consecutive pulses. The period of time may be longer or much longer than a pulse period of a single pulse (i.e. the length of time T). In addition, the target object 102 can reflect the pulsed light signal EL to generate the reflected signal RL.

Step 204: During arrival of the reflected signal at a receiver side, sample the reflected signal multiple times according to a predetermined sampling interval within a predetermined sampling duration and accordingly generate a sampling result. For example, within a period of time equal to a pulse period of a single pulse (i.e. the predetermined sampling duration) during arrival of the reflected signal RL at the ToF sensor 130, the control circuit 120 may control the ToF sensor 130 to sample the reflected signal RL multiple times according to predetermined sampling interval, thereby generating the sampling result SR. As another example, during a period of time in which the pulse generator unit 110 sends the Kth pulse of the N consecutive pulses, the control circuit 120 may control the ToF sensor 130 to sample the reflected signal RL multiple times according to the predetermined sampling interval, thereby generating the sampling result SR. K is a positive integer greater than one and less than or equal to N.

Step 206: Detect time of flight of a single pulse of the N consecutive pulses traveling from the transmitter side to the receiver side according to the sampling result. For example, the ToF sensor 130, or the processing circuit 134, may perform signal processing (e.g. mixing operations or discrete Fourier transforms) on the sampling result SR to calculate a phase shift between the reflected signal RL and the pulsed light signal EL, thereby detecting a ToF of a single pulse of the pulsed light signal EL.

Step 208: Measure a distance between the target object and a reference position according to the time of flight. The reference position may be, but is not limited to, a position of the transmitter side, a position of the receiver side, a position of an electronic device including the transmitter side and the receiver side, or a reference position which can be defined according to a positional relationship between the transmitter side, the receiver side and the target object. For example, in some embodiments where the distance between the pulse generator unit 110 and each pixel of the pixel array 132 is much shorter than the distance between the pulse generator unit 110 and the target object 102 and the distance between each pixel and the target object 102, the ToF sensor 130, or the processing circuit 134, may measure the distance between the target object 102 and each pixel according to the ToF of the single pulse of the pulsed light signal EL.

In step 204, the predetermined sampling duration may be longer than or equal to a pulse period of the single pulse of the N consecutive pulses, such that sampling operations can be applied to a whole pulse. However, this is not intended to limit the scope of the present disclosure. In some embodiments, the predetermined sampling duration may be slightly shorter than the pulse period of the single pulse.

In some embodiments, besides a photo response signal generated from a light sensor in response to the reflected signal RL, a sampling result of each pixel may include a reference signal generated without reference to the reflected signal RL. For example, the step of sampling the reflected signal (step 204) may include: outputting a reference signal without reference to the reflected signal RL while outputting a photo response signal of a pixel, and subtracting the reference signal from the photo response signal to thereby produce the sampling result of the pixel. Noise and interference in the surroundings imposed on the sampling result can therefore be reduced.

Additionally, in some embodiments, a photo response signal generated by a light sensor of a pixel can be outputted from two transmission paths. Each transmission path is configured to receive the photo response signal when turned on, and accordingly output the photo response signal. Also, each transmission path is configured to generate a reference signal when turned off. The respective on/off timings of the two transmission paths can be controlled by two control signals having different phases, respectively. In this way, the proposed ToF based distance measuring scheme can simulate a CW modulation sensing mechanism by modulating transmitted light according to consecutive pulses which are sent intermittently.

Figure 3:
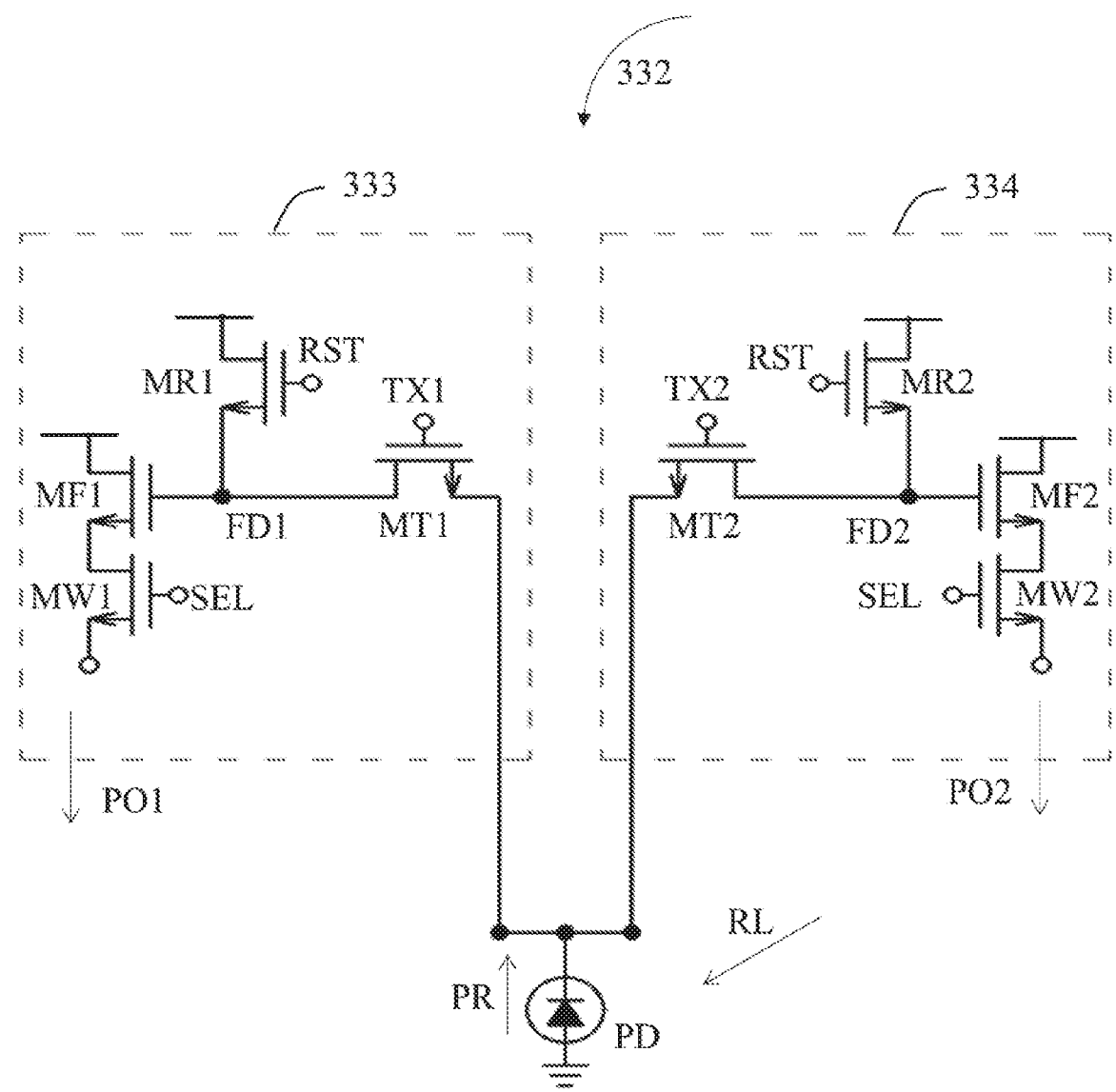
FIG. 3 is a diagram illustrating an exemplary circuit structure of a pixel in the pixel array shown in FIG. 1 in accordance with an embodiment of the present disclosure.

For illustrative purposes, the proposed ToF based distance measuring scheme is described with reference to some exemplary pixel circuits in the following embodiments. However, this is not meant to be limitations of the present disclosure. Any pixel circuits capable of utilizing the distance measuring method shown in FIG. 2 to detect time of flight can be used without departing from the scope of the present disclosure. Referring to FIG. 3, an exemplary circuit structure of a pixel in the pixel array 132 shown in FIG. 1 is illustrated in accordance with an embodiment of the present disclosure. In the present embodiment, the pixel 332 includes, but is not limited to, a light sensor PD, a first photoelectric readout circuit 333 and a second photoelectric readout circuit 334. The light sensor PD, such as a photodiode, is configured to perform light sensing. For example, the light sensor PD may sense the reflected signal RL to generate a photo response signal PR, wherein the photo response signal PR may be outputted from at least one of the first photoelectric readout circuit 333 (e.g. a first transmission path) and the second photoelectric readout circuit 334 (e.g. a second transmission path). In some embodiments, the photodiode can convert a received light signal to a photocurrent signal. As a result, the photo response signal PR may be a current signal indicative of a signal level of a light signal. A photoelectric readout circuit can be configured to read the photocurrent signal.

During arrival of the reflected signal RL at the pixel 332, the first photoelectric readout circuit 333 may be selectively coupled to the light sensor PD according to a first control signal TX1 within a predetermined sampling duration, thereby generating a first pixel output PO1. The first control signal TX1 may be provided by the control circuit 120 shown in FIG. 1. In other words, the pixel 332 may receive the photo response signal PR selectively through the first transmission path according to the first control signal TX1, and accordingly generate the first pixel output PO1.

In addition, within the predetermined sampling duration, the second photoelectric readout circuit 334 may be selectively coupled to the light sensor PD according to a second control signal TX2, thereby generating a second pixel output PO2. The second control signal TX2 may be provided by the control circuit 120 shown in FIG. 1, and have a phase different from that of the first control signal TX1. In other words, the pixel 332 may receive the photo response signal PR selectively through the second transmission path according to the second control signal TX2, and accordingly generate the first pixel output PO2.

It is worth noting that at least one of the first photoelectric readout circuit 333 and the second photoelectric readout circuit 334 is coupled to the light sensor PD within the predetermined sampling duration. The processing circuit 134 shown in FIG. 1 may sample the first pixel output PO1 and the second pixel output PO2 of each pixel every predetermined sampling interval according to the sample control signal SC. Also, the processing circuit 134 shown in FIG. 1 may generate the sampling result SR according to the first pixel output PO1 and the second pixel output PO2. As a result, regarding sampling operations performed each time the predetermined sampling interval has elapsed, the photo response signal PR may be outputted to the processing circuit 134 shown in FIG. 1 through at least one of the first photoelectric readout circuit 333 and the second photoelectric readout circuit 334. For example, when the first photoelectric readout circuit 333 is coupled to the light sensor PD within the predetermined sampling duration, the first photoelectric readout circuit 333 may be configured to sample the photo response signal PR to thereby generate the first pixel output PO1. When the second photoelectric readout circuit 334 is coupled to the light sensor PD within the predetermined sampling duration, the second photoelectric readout circuit 334 may be configured to sample the photo response signal PR to thereby generate the second pixel output PO2.

In the present embodiment, the first photoelectric readout circuit 333 may include, but is not limited to, a first reset transistor MR1, a first transfer transistor MT1, a first output transistor MF1 and a first readout transistor MW1. The second photoelectric readout circuit 334 may include, but is not limited to, a second reset transistor MR2, a second transfer transistor MT2, a second output transistor MF2 and a second readout transistor MW2. The first reset transistor MR1 and the second reset transistor MR2 are configured to reset a first floating diffusion node FD1 and a second floating diffusion node FD2, respectively, according to a reset signal RST. The reset signal RST may be provided by the control circuit 120 shown in FIG. 1. The first transfer transistor MT1 and the second transfer transistor MT2, each of which is coupled to the light sensor PD, may be turned on according to the first control signal TX1 and the second control signal TX2 respectively. In other words, the first transfer transistor MT1 and the second transfer transistor MT2 are controlled by the first control signal TX1 and the second control signal TX2, respectively, to be connected to and disconnected from the light sensor PD. Also, regarding each sampling operation performed within the predetermined sampling duration, at least one of the first transfer transistor MT1 and the second transfer transistor MT2 is coupled to the light sensor PD according to a corresponding control signal. The photo response signal PR can be transferred to the first floating diffusion node FD1 or the second floating diffusion node FD2 accordingly.

The first output transistor MF1 and the second output transistor MF2 are configured to amplify respective voltage signals at the first floating diffusion node FD1 and the second floating diffusion node FD2 respectively, thereby generating the first pixel output PO1 and the second pixel output PO2 respectively. The first readout transistor MW1 and the second readout transistor MW2 are configured to selectively output the first pixel output PO and the second pixel output PO2, respectively, according to a select signal SEL. The select signal SEL may be provided by the control circuit 120 shown in FIG. 1. Within the predetermined sampling duration, the first readout transistor MW1 and the second readout transistor MW2 may be turned on according to the select signal SEL, thereby outputting the first pixel output PO1 and the second pixel output PO2 respectively.

As the photo response signal PR would be sent to at least one of the first transfer transistor MT1 and the second transfer transistor MT2 within the predetermined sampling duration, at least one of the first pixel output PO1 and the second pixel output PO2, which are sampled by the processing circuit 134 shown in FIG. 1 each time the predetermined sampling interval has elapsed, may include information on the photo response signal PR.

In some embodiments, in addition to the photo response signal PR generated in response to the reflected signal RL, one of the first pixel output PO1 and the second pixel output PO2 may include a reference signal generated without reference to the reflected signal RL. Each time the first pixel output PO and the second pixel output PO2 are sampled, the processing circuit 134 shown in FIG. 1 may subtract one of the first pixel output PO1 and the second pixel output PO2 from the other to generate the sampling result SR, thereby reducing noise and interference in the surroundings imposed on the sampling result SR. For example, in a sampling operation within the predetermined sampling duration, the second photoelectric readout circuit 334 may be coupled to the light sensor PD (e.g. the second transfer transistor MT2 is coupled to the light sensor PD) to sense the reflected signal RL to thereby generate the second pixel output PO2. The first photoelectric readout circuit 333 may be uncoupled from the light sensor PD (e.g. the first transfer transistor MT1 is uncoupled from the light sensor PD). As the first readout transistor MW1 may still be turned on according to the select signal SEL when the first transfer transistor MT1 is uncoupled from the light sensor PD, the first pixel output PO1 may be a first reference signal carrying noise information associated with the sampling operation. The processing circuit 134 shown in FIG. 1 may subtract one of the first pixel output PO and the second pixel output PO2 from the other to reduce noise and interference in the surroundings imposed on the sampling result SR.

In other words, within the predetermined sampling duration, the first photoelectric readout circuit 333 may generate the first reference signal when uncoupled from the light sensor PD. The first reference signal can serve as the first pixel output PO1. Similarly, within the predetermined sampling duration, the second photoelectric readout circuit 334 may generate a second reference signal when uncoupled from the light sensor PD. The second reference signal, carrying noise information associated with the sampling operation, can serve as the second pixel output PO2. The processing circuit 134 shown in FIG. 1 may be configured to, each time the first pixel output PO1 and the second pixel output PO2 are sampled, subtract one of the first pixel output PO1 and the second pixel output PO2 from the other to generate the sampling result, thereby reducing noise and interference in the surroundings imposed on the sampling result SR.

Figure 4:
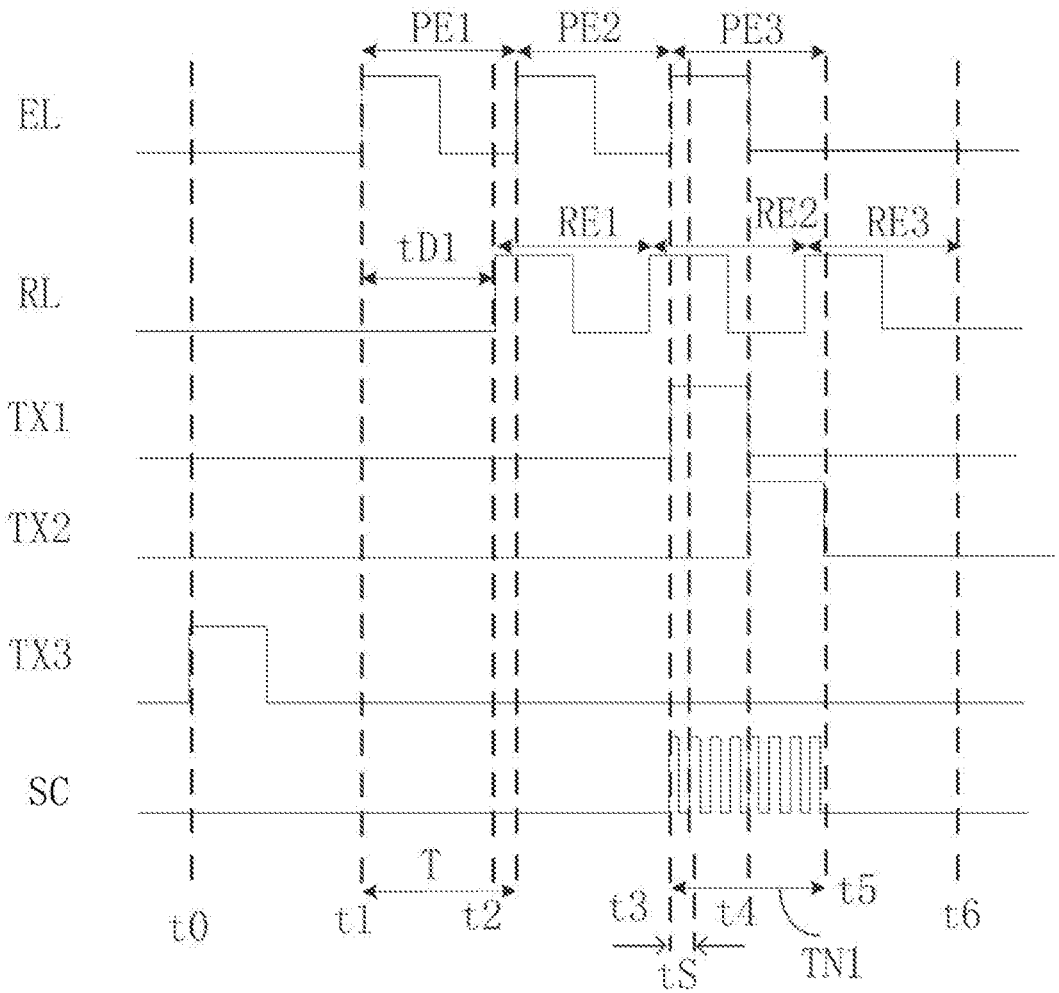
FIG. 4 is a timing diagram illustrating signal waveforms associated with the pixel shown in FIG. 3 in accordance with an embodiment of the present disclosure.

FIG. 4 is a timing diagram illustrating signal waveforms associated with the pixel 332 shown in FIG. 3 in accordance with an embodiment of the present disclosure. Referring to FIG. 1, FIG. 3 and FIG. 4, at time t1, the pulse generator unit 110 may send three consecutive pulses PE1-PE3 which serve as the pulsed light signal EL. The pulses PE1-PE3 may have a same pulse period labeled T. When a time delay tD1 has elapsed, the reflected signal RL or the pulses RE1-RE3, which are reflected from the target object 102 in response the pulses PE1-PE3 reflected by the target object 102, may arrive at the pixel 332 (time t2).

Next, during arrival of the reflected signal RL at the pixel 332 (i.e. between time t2 and time t6), the pixel 332 may sense the reflected signal RL and generate the first pixel output PO1 and the second pixel output PO2 within a predetermined sampling duration TN1. In the present embodiment, the control circuit 120 may use a period of time (between time t3 and time t5), taken by the pulse generator unit 110 to send the pulse PE3, as the predetermined sampling duration TN1. As a result, during the period of time taken by the pulse generator unit 110 to send the pulse PE3, the pixel 332 may sense the reflected signal RL to generate the photo response signal PR, and output the first pixel output PO1 and the second pixel output PO2. The processing circuit 134 may refer to the sample control signal SC to sample the first pixel output PO and the second pixel output PO2 once each time a predetermined sampling interval tS has elapsed.

In the present embodiment, the predetermined sampling interval tS may be one-eighth of a pulse period. As the processing circuit 134 may sample the first pixel output PO and the second pixel output PO2 once each time the predetermined sampling interval tS has elapsed, the processing circuit 134 may sample the first pixel output PO and the second pixel output PO2 eight times. These eight sampling operations may reflect signal information on eight phases (e.g. 0, π/4, π/2, 3π/4, π, 5π/4, 3π/2 and 7π/4) of the reflected signal RL in a pulse period. However, this is not intended to limit the scope of the present disclosure. Other predetermined sampling intervals may be used for sampling operations. For example, the predetermined sampling interval tS may be a quarter or one-sixteenth of a pulse period. The corresponding sampling result may include respective results of four/sixteen sampling operations which are performed at four/sixteen phases in a pulse period respectively. As another example, the predetermined sampling interval tS may be one-Mth of a pulse period of a single pulse of the consecutive pulses PE1-PE3, wherein M is a positive integer greater than one. It is worth noting that the larger the number of phases corresponding to the sampling result is, the higher the harmonic order of the sampling result eliminated using mixing operations and discrete Fourier transforms can be. The accuracy of phase shift information or baseband information can be enhanced accordingly. As the phase shift information corresponds to a result of ToF measurement, the accuracy of the ToF measurement can be enhanced.

In addition, the first control signal TX1 and the second control signal TX2 may have a phase difference of 180 degrees. The first transfer transistor MT1 is turned on at time t3 and turned off at time t4. The second transfer transistor MT2 is turned on at time t4 and turned off at time t5. As a result, between time t3 and time t4, the first pixel output PO1 corresponds to the photo response signal PR, generated from the light sensor PD in response to the reflected signal RL, while the second pixel output PO2 is a corresponding reference signal. Such reference signal is a signal that is outputted from the second readout transistor MW2 when the second photoelectric readout circuit 334 does not receive the photo response signal PR outputted from the light sensor PD. This reference signal may carry noise information produced when the pixel 332 samples the reflected signal RL. Between time t4 and time t5, the second pixel output PO2 corresponds to the photo response signal PR, generated from the light sensor PD in response to the reflected signal RL, while the first pixel output PO is a corresponding reference signal. Similarly, the reference signal, carrying noise information produced when the pixel 332 samples the reflected signal RL, is a signal that is outputted from the first readout transistor MW1 when the first photoelectric readout circuit 333 does not receive the photo response signal PR outputted from the light sensor PD.

The processing circuit 134 may generate a sampling result of the pixel 332 according to the first pixel output PO and the second pixel output PO2. For example, each time the first pixel output PO1 and the second pixel output PO2 are sampled, the processing circuit 134 may subtract one of the first pixel output PO1 and the second pixel output PO2 from the other and accordingly generate the sampling result of the pixel 332. Noise and interference imposed on the sampling result can therefore be reduced. In addition, as the pixel 332 may sense the reflected signal RL to generate the photo response signal PR within the predetermined sampling duration TN1 (including a period of time equal to a pulse period), and sample once the first pixel output PO1 or the second pixel output PO2 generated from each pixel each time the predetermined sampling interval tS (e.g. one-eighth of a pulse period or T/8) has elapsed, the ToF sensor 130 may sample the reflected signal RL multiple times within the predetermined sampling duration TN1 to thereby obtain signal information associated with a complete pulse period.

By performing associated signal processing (e.g. signal processing including mixing operations and discrete Fourier transforms) on the sampling result of the pixel 332, the processing circuit 134 may obtain information on a phase shift between the pulsed light signal EL and the reflected signal RL according to the sampling result of the pixel 332. The information may be identical/similar to that obtained using CW modulation. For example, the processing circuit 134 may generate a mixing result by performing a mixing operation on the pulsed light signal EL and a sampling result (e.g. a result of subtraction of the first pixel output PO1 and the second pixel output PO2) corresponding to each sampling operation, perform a discrete Fourier transform on the mixing result, and obtain phase shift information (e.g. baseband information) according to a result of the discrete Fourier transform. In this way, the proposed ToF based distance measuring scheme may modulate transmitted light according to consecutive pulses which are sent intermittently, thereby sending consecutive light pulses intermittently. During arrival of a corresponding reflected signal at a receiver side, the proposed ToF based distance measuring scheme may sample the reflected signal multiple times within a period of time, such as a duration of a pulse period of a single pulses. The proposed ToF based distance measuring scheme may therefore achieve effects similar to those obtained using CW modulation, and have good measurement quality.

Figure 5:
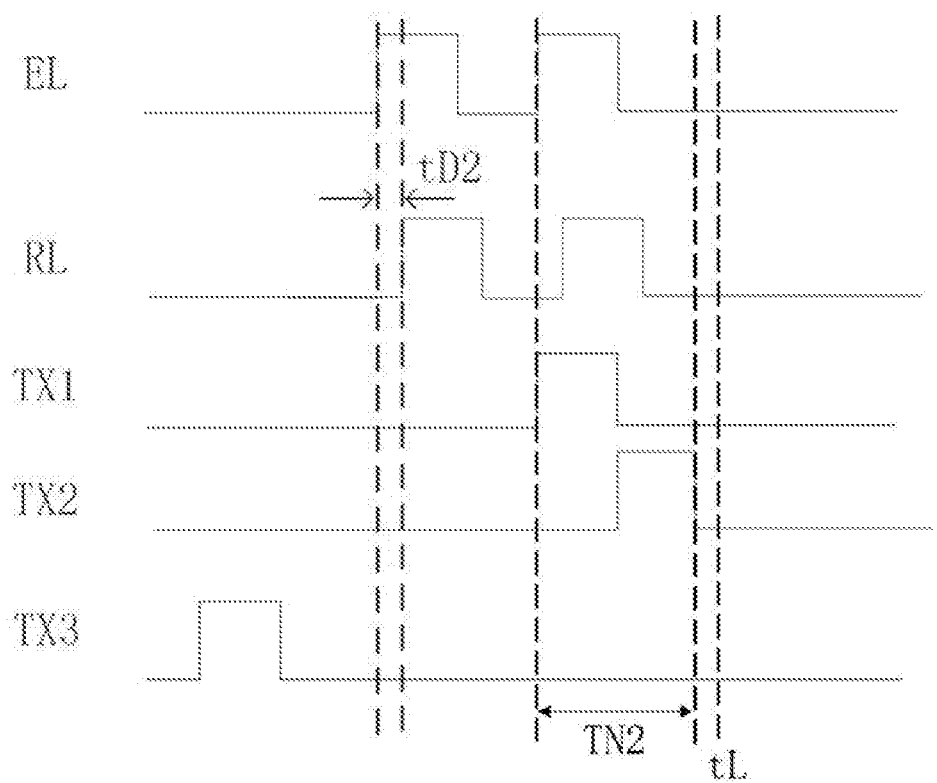
FIG. 5 illustrates a timing diagram illustrating signal waveforms associated with the pixel shown in FIG. 3 in accordance with another embodiment of the present disclosure.

It is worth noting that, in some embodiments where a distance related a target object falls within a predetermined ratio of a maximum range of a ToF based distance measuring system, sending two consecutive pulses intermittently can successfully detect time of flight of a pulsed light signal. FIG. 5 illustrates a timing diagram illustrating signal waveforms associated with the pixel 332 shown in FIG. 3 in accordance with another embodiment of the present disclosure. In the present embodiment, as the distance between the target object 102 shown in FIG. 1 and the pixel 332 is relatively short, a difference between the time when the pulsed light signal EL is sent and the time when the reflected signal RL is received (i.e. a time delay tD2) would be relatively short, e.g. one-eighth of a pulse period. Even if the pulse generator unit 110 shown in FIG. 1 merely sends two consecutive pulses, the pixel 332 may complete sensing operation associated with a complete pulse period before the whole of the last pulse of the reflected signal RL returns to the pixel 332 (i.e. time tL). For example, the control circuit 120 shown in FIG. 1 may use a period of time, taken to send the last pulse, as a predetermined sampling duration TN2. The processing circuit 134 shown in FIG. 1 may sample a pixel output of the pixel 332 once every predetermined sampling interval (e.g. one-eighth of a pulse period). As shown in FIG. 5, the processing circuit 134 shown in FIG. 1 may obtain signal information associated with a complete pulse period of the reflected signal RL, wherein the signal information may be identical/similar to phase shift information obtained using CW modulation.

The existing measurement technique utilizing CW modulation has to send a plurality of light signals continuously and sample a reflected signal during a plurality of consecutive signal periods in order to obtain phase shift information. In contrast, the proposed ToF based distance measuring scheme can obtain phase shift information by sending two or more consecutive light pulses intermittently and performing sampling operation within a single pulse period, rather than sending a plurality of light signal continuously and sampling a reflected signal during a plurality of consecutive signal periods. In addition, as instantaneous power of a light pulse is much higher than energy from ambient light, the proposed ToF based distance measuring scheme can greatly reduce effects of the ambient light upon a detection result. Further, as the proposed ToF based distance measuring scheme intermittently sends a plurality of series of consecutive light pulses, each of which including two or more consecutive light pulses, a period of time taken to send the two or more consecutive light pulses is quite short when compared with a time interval between two consecutive series of consecutive light pulses. This means that the average power of the proposed ToF based distance measuring scheme is quite low. In other words, the proposed ToF based distance measuring scheme can maintain good measurement quality, rapidly measure a distance related to a target object, and consume low power.

The above is provided for illustrative purposes, and is not intended to limit the scope of the present disclosure. For example, the pixel array 132 shown in FIG. 1 may employ shared pixel architecture to save chip area. As another example, the photoelectric readout circuit shown in FIG. 3 may be implemented using other circuit structures. As long as phase shift information can be generated by intermittently sending N consecutive pulses and sampling a corresponding reflected signal within a predetermined sampling duration (e.g. a period of time equal to a pulse period) during arrival of the reflected signal at a receiver side, associated modifications and alternatives fall within the spirit and scope of the present disclosure.

Figure 6:
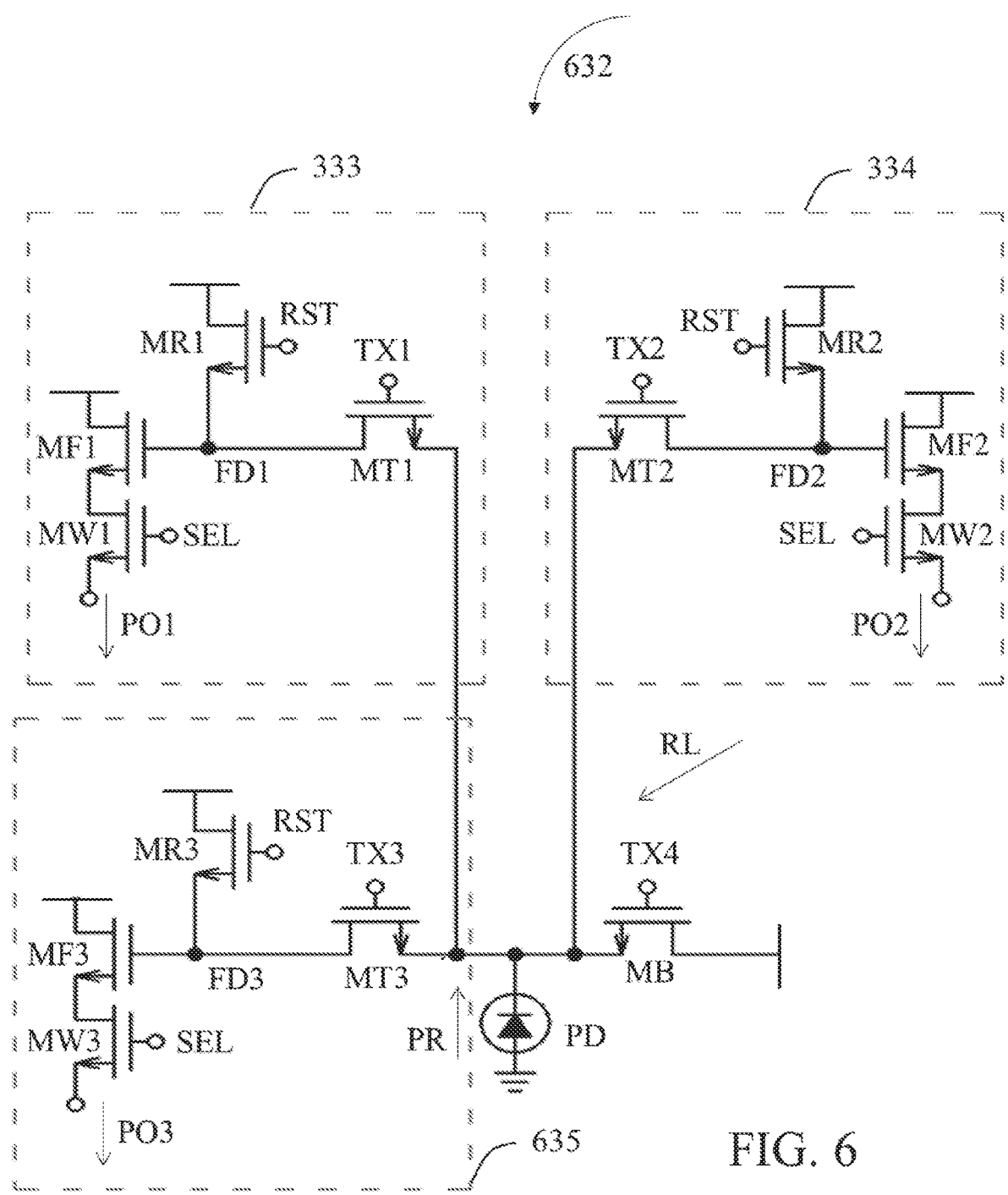
FIG. 6 is a diagram illustrating an exemplary circuit structure of a pixel in the pixel array shown in FIG. 1 in accordance with another embodiment of the present disclosure.

FIG. 6 is a diagram illustrating an exemplary circuit structure of a pixel in the pixel array 132 shown in FIG. 1 in accordance with another embodiment of the present disclosure. The pixel 632 shown in FIG. 6 is similar/identical to the pixel 332 shown in FIG. 3 except that the pixel 632 further includes a third photoelectric readout circuit 635, which is provided for further reducing effects of ambient information/noise upon the measurement quality. In the present embodiment, the third photoelectric readout circuit 635 includes, but is not limited to, a third transfer transistor MT3, a third reset transistor MR3, a third output transistor MF3 and a third readout transistor MW3. The third transfer transistor MT3, coupled to the light sensor PD, may be turned on according to a third control signal TX3, which can be provided by the control circuit 120 shown in FIG. 1. The third reset transistor MR3 is configured to reset a third floating diffusion node FD3 according to the reset signal RST. The third output transistor MF3 is configured to amplify a voltage signal at the third floating diffusion node FD3, and accordingly generate a third pixel output PO3. The third readout transistor MW3 is configured to selectively output the third pixel output PO3 according to the select signal SEL.

In addition, the pixel 632 may include an anti-blooming transistor MB. The anti-blooming transistor MB is configured to extract photoelectrons, which are generated from the light sensor PD in response to reception of ambient light, to reduce/minimize undesirable effects of the photoelectrons upon the circuit operation. For example, the photoelectrons may be transferred to a power source. The anti-blooming transistor MB may be turned on according to a fourth control signal TX4, which may be provided by the control circuit 120 shown in FIG. 1.

Figure 7:
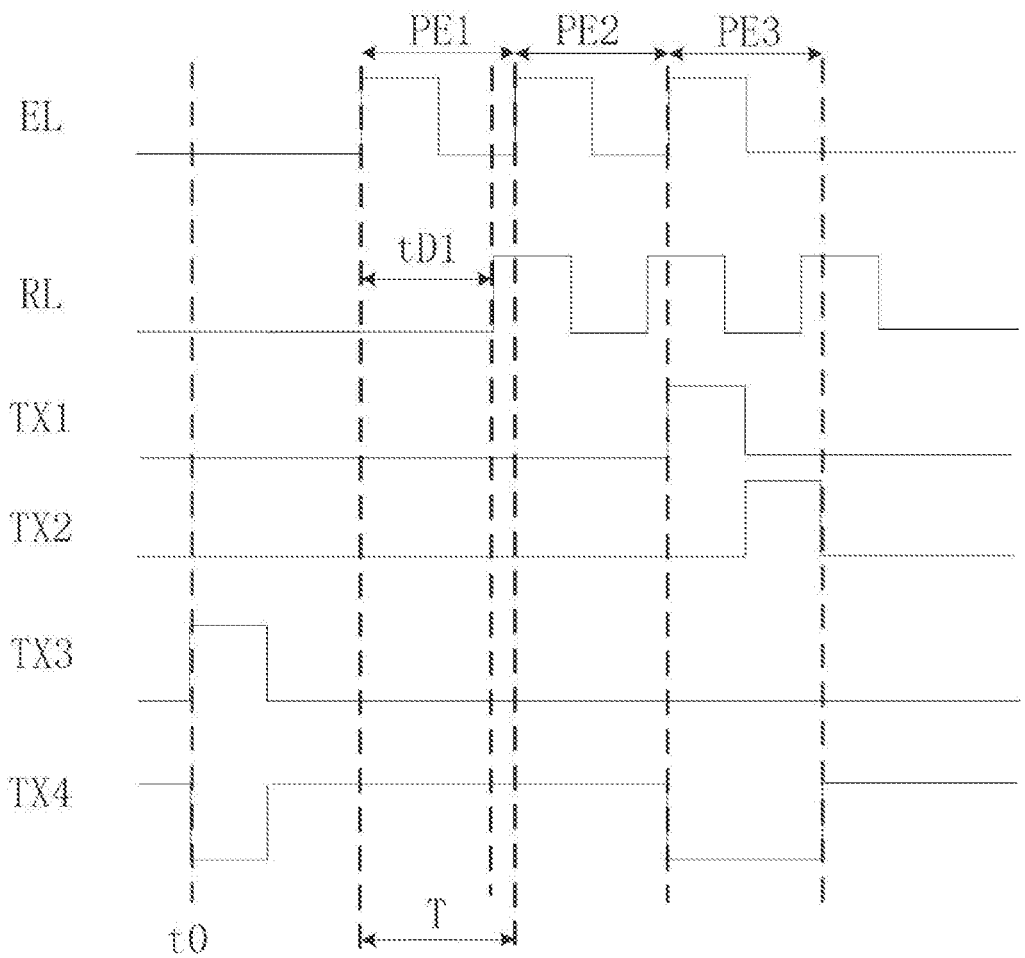
FIG. 7 is a timing diagram illustrating signal waveforms associated with the pixel shown in FIG. 6 in accordance with an embodiment of the present disclosure.

Referring to FIG. 6 and FIG. 7, signal waveforms associated with the pixel 632 shown in FIG. 6 are illustrated in FIG. 7 in accordance with an embodiment of the present disclosure. The timing diagram shown in FIG. 7 is similar/identical to that shown in FIG. 4 except that the third transfer transistor MT3 can be turned on according to the third control signal TX3 (time t0) before the pulse generate unit 110 shown in FIG. 1 sends the consecutive pulses PE1-PE3. Accordingly, the third pixel output PO3, generated from the light sensor PD in response to reception of ambient light, can be outputted from the third transfer transistor MT3. The third pixel output PO3 may be provided for the processing circuit 134 shown in FIG. 1. As a result, when processing a sampling result of the pixel 632 (e.g. a result of subtraction of the first pixel output PO1 and the second pixel output PO2), the processing circuit 134 shown in FIG. 1 may subtract ambient noise components from the sampling result according to the third pixel output PO3.

Additionally, in the embodiment shown in FIG. 7, during a period of time in which the first transfer transistor MT1, the second transfer transistor MT2 and the third transfer transistor MT3 are turned off, the anti-blooming transistor MB may be turned on according to the fourth control signal TX4 to thereby extract photoelectrons which are generated from the light sensor PD in response to reception of ambient light. As a result, the ambient light immunity of the pixel 632 can be enhanced.

It is worth noting that the circuit structure shown in FIG. 6 is provided for illustrative purposes, and is not intended to limit the scope of the present disclosure. In some embodiments, it is possible to use one of the third photoelectric readout circuit 635 and the anti-blooming transistor MB to reduce effects of ambient information/noise upon the measurement quality.

Figure 8:
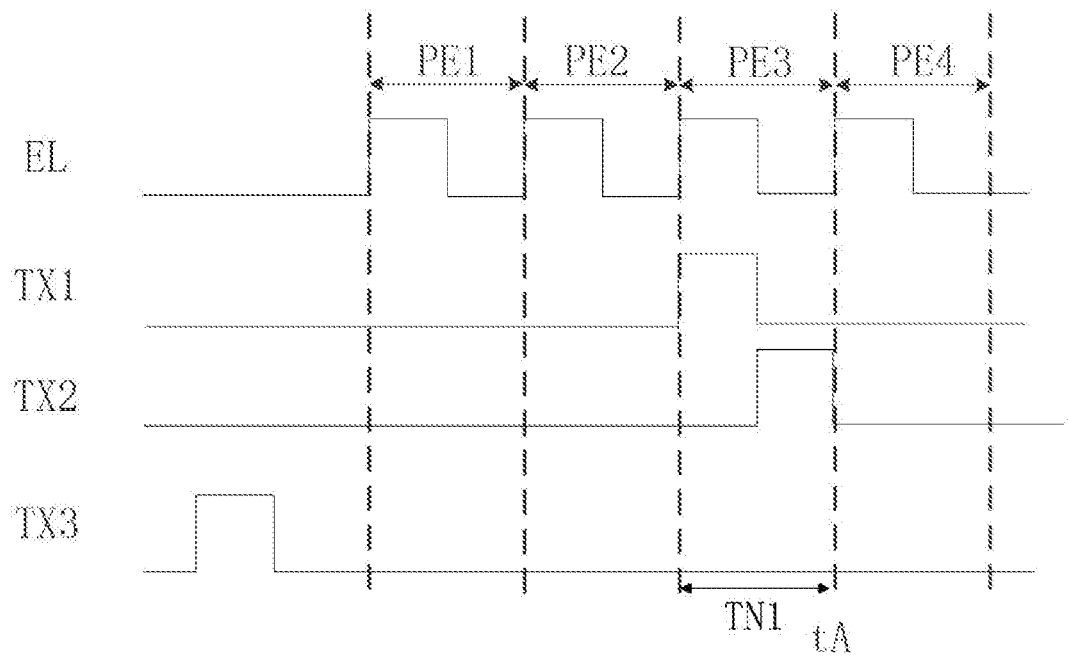
FIG. 8 is a timing diagram illustrating signal waveforms associated with the pixel shown in FIG. 3 in accordance with another embodiment of the present disclosure.

In some embodiments, the proposed ToF based distance measuring scheme may generate one or more pulses after the predetermined sampling duration has expired, thereby enhancing the quality of sensing operation. FIG. 8 is a timing diagram illustrating signal waveforms associated with the pixel 332 shown in FIG. 3 in accordance with another embodiment of the present disclosure. The timing diagram shown in FIG. 8 is similar/identical to that shown in FIG. 4 except that the pulsed light signal EL further includes a pulse PE4 generated after the expiration of the predetermined sampling duration TN. For example, the second transfer transistor TX2 may have a turn-off delay under actual usage conditions, such that the second transfer transistor TX2 may be turned off after a period of time has elapsed from time tA. The second transfer transistor TX2 may output a signal unrelated to the reflected signal RL after time tA, which makes it difficult for the processing circuit 134 shown in FIG. 1 to determine ToF. In the present embodiment, the pulse PE4 may be provided to ensure that a signal output from a transfer transistor would be generated in response to the reflected signal RL even if the transfer transistor does not turn off immediately.

Figure 9:
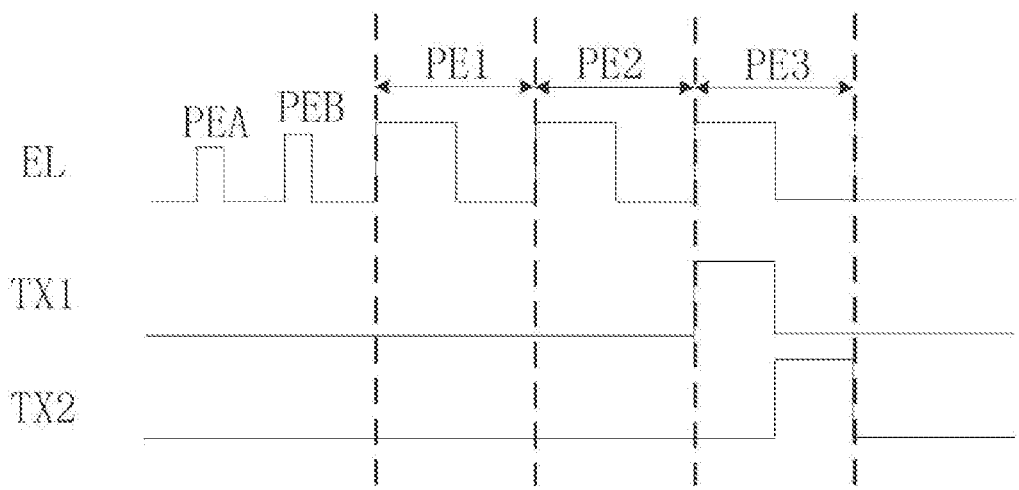
FIG. 9 is a timing diagram illustrating signal waveforms associated with the pixel shown in FIG. 3 in accordance with another embodiment of the present disclosure.

In some embodiments, the proposed ToF based distance measuring scheme may not start ToF detection until a light pulse becomes stable. FIG. 9 is a timing diagram illustrating signal waveforms associated with the pixel 332 shown in FIG. 3 in accordance with another embodiment of the present disclosure. The timing diagram shown in FIG. 8 is similar/identical to that shown in FIG. 4 except that the pulsed light signal EL further includes one or more pulses PEA and PEB. In the present embodiment, the pulse generator unit 110 shown in FIG. 1 may firstly send the one or more pulses PEA and PEB to wait for signal quality to stabilize. As shown in FIG. 9, the stabilized pulse PE1/PE2/PE3 may have a predetermined waveform.

Figure 10:
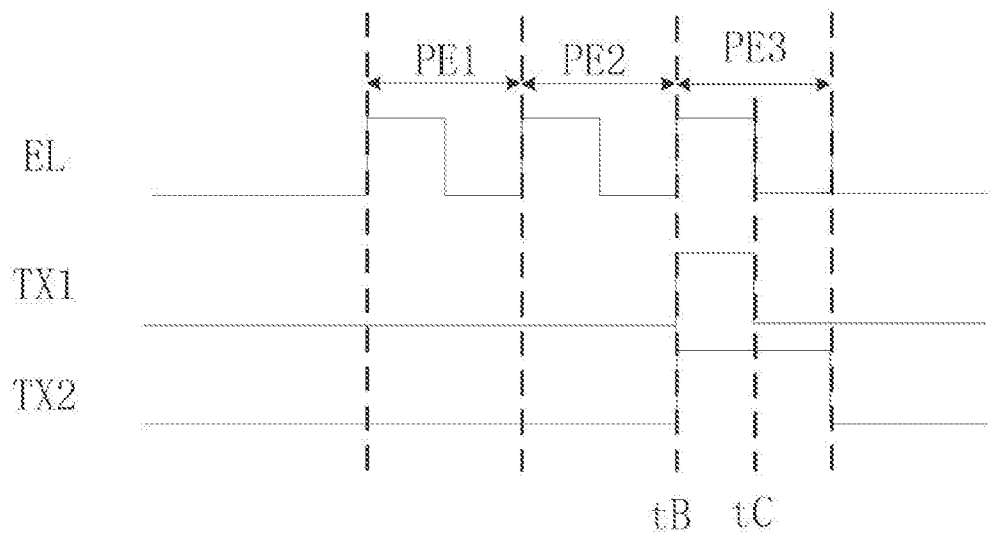
FIG. 10 is a timing diagram illustrating signal waveforms associated with the pixel shown in FIG. 3 in accordance with another embodiment of the present disclosure.

In some embodiments, a phase difference between control signals used for the proposed ToF based distance measuring scheme is not limited to 180 degrees. FIG. 10 is a timing diagram illustrating signal waveforms associated with the pixel 332 shown in FIG. 3 in accordance with another embodiment of the present disclosure. The timing diagram shown in FIG. 10 is similar/identical to that shown in FIG. 4 except that the second control signal TX2 stays at a high signal level within the predetermined sampling duration TN1. As a result, the second transfer transistor MT2 is turned on within the predetermined sampling duration TN1. It is worth noting that, in the present embodiment, a result of subtracting the first pixel output PO1 (outputted from the first photoelectric readout circuit 333) from the second pixel output PO2 (outputted from the second photoelectric readout circuit 334) is substantially identical/similar to the second pixel output PO2 outputted from the second photoelectric readout circuit 334 in the embodiment shown in FIG. 4. As a result, the signal waveforms in the embodiment shown in FIG. 10 may be used for ToF detection.

Figure 11:
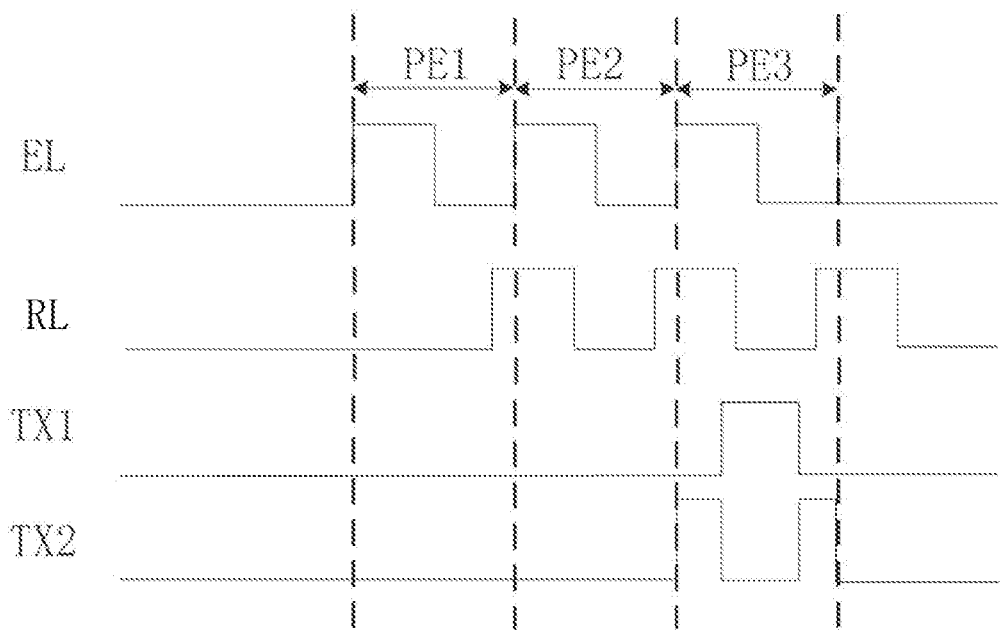
FIG. 11 is a timing diagram illustrating signal waveforms associated with the pixel shown in FIG. 3 in accordance with another embodiment of the present disclosure.

FIG. 11 is a timing diagram illustrating signal waveforms associated with the pixel 332 shown in FIG. 3 in accordance with another embodiment of the present disclosure. Compared with the first control signal TX1 shown in FIG. 4, the first control signal TX1 shown in FIG. 1 has a phase delay of 90 degrees. Also, the first control signal TX1 and the second control signal TX2 shown in FIG. 11 have a phase difference of 180 degrees. It is worth noting that, before the whole of the last pulse of the reflected signal RL completely returns to the pixel 332, the pixel 332 may complete sensing operation associated with a complete pulse period according to the control signal TX1 and the second control signal TX2 shown in FIG. 11. As a result, the processing circuit 134 shown in FIG. 1 may still successfully obtain signal information corresponding to a complete pulse period of the reflected signal RL.

After reading the above paragraphs directed to FIG. 1 to FIG. 11, those skilled in the art should appreciate that a phase relationship between control signals may be implemented in various ways as long as signal information corresponding to a complete pulse period of the reflected signal RL can be successfully obtained. Thus, associated modifications and alternatives are omitted for brevity.

While certain exemplary embodiments have been described and shown in the accompanying drawing, it is to be understood that such embodiments are merely illustrative of and not restrictive on the present disclosure. Those skilled in the art will readily observe that numerous modifications and alterations of the device and method may be made while retaining the teachings of the present disclosure. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A time-of-flight based distance measuring method, comprising:
   sending N consecutive pulses from a transmitter side intermittently, N being a positive integer greater than one, wherein the N consecutive pulses are reflected by a target object, and a reflection signal is reflected from the target object accordingly;
   during arrival of the reflected signal at a receiver side, performing sampling operation to sample the reflected signal multiple times according to a predetermined sampling interval within a predetermined sampling duration and accordingly generating a sampling result;
   detecting time of flight of a single pulse of the N consecutive pulses traveling from the transmitter side to the receiver side according to the sampling result, wherein the sampling operation is disabled during a time interval between sending a first one of the N consecutive pulses and sending a Kth pulse of the N consecutive pulses, and is enabled at a beginning of the Kth pulse of the N consecutive pulses; K is a positive integer greater than one and less than or equal to N; and
   measuring a distance between the target object and a reference position according to the time of flight.

2. The distance measuring method of claim 1, wherein the predetermined sampling duration is longer than or equal to a pulse period of the single pulse of the N consecutive pulses.

3. The distance measuring method of claim 1, further comprising:
   using a period of time, taken by the transmitter to send the Kth pulse of the N consecutive pulses, as the predetermined sampling duration.

4. The distance measuring method of claim 1, wherein the step of sampling the reflected signals the multiple times according to the predetermined sampling interval and accordingly generating the sampling result comprises:
   sampling the reflected signal once each time the predetermined sampling interval has elapsed.

5. The distance measuring method of claim 4, wherein the predetermined sampling interval is equal to 1/M of a pulse period of one of the N consecutive pulses, and M is a positive integer greater than one.

6. The distance measuring method of claim 1, wherein the N consecutive pulses are N consecutive light pulses; and the step of sampling the reflected signals the multiple times according to the predetermined sampling interval and accordingly generating the sampling result comprises:
   sensing the reflected signal at the receiver side to generate a photo response signal;
   selectively utilizing a first transmission path to receive the photo response signal according to a first control signal within the predetermined sampling duration, and accordingly generating a first pixel output;
   selectively utilizing a second transmission path to receive the photo response signal according to a second control signal within the predetermined sampling duration, and accordingly generating a second pixel output, wherein the second control signal and the first control signal have different phases, and at least one of the first transmission path and the second transmission path is utilized to receive the photo response signal within the predetermined sampling duration; and
   sampling the first pixel output and the second pixel output each time the predetermined sampling interval has elapsed, and accordingly generating the sampling result according to the first pixel output and the second pixel output.

7. The distance measuring method of claim 6, wherein the step of generating the first pixel output comprises:
   when the photo response signal is received through the first transmission path, sampling the photo response signal to generate the first pixel output; and
   the step of generating the second pixel output comprises:
   when the photo response signal is received through the second transmission path, sampling the photo response signal to generate the second pixel output.

8. The distance measuring method of claim 7, wherein the step of generating the first pixel output further comprises:
   when the first transmission path is not utilized for receiving the photo response signal, generating a first reference signal serving as the first pixel output;
   the step of generating the second pixel output further comprises:
   when the second transmission path is not utilized for receiving the photo response signal, generating a second reference signal serving as the second pixel output; and
   generating the sampling result according to the first pixel output and the second pixel output comprises:
   each time the first pixel output and the second pixel output are sampled, generating the sampling result by subtracting one of the first pixel output and the second pixel output from the other of the first pixel output and the second pixel output.

9. The distance measuring method of claim 6, wherein the first control signal and the second control signal have a phase difference of 180 degrees.

10. A time-of-flight based distance measuring system, comprising:
    a pulse generator unit;
    a control circuit, coupled to the pulse generator unit, the control circuit being configured to drive the pulse generator unit to send N consecutive pulses intermittently, N being a positive integer greater than one, wherein the N consecutive pulses are reflected by a target object and a reflection signal is reflected from the target object accordingly;
    a time-of-flight sensor, controlled by the control circuit, the time-of-flight sensor being configured to, during arrival of the reflected signal at the time-of-flight sensor, perform sampling operation to sample the reflected signal multiple times according to a predetermined sampling interval within a predetermined sampling duration and accordingly generate a sampling result, wherein the sampling operation is disabled during a time interval between sending a first one of the N consecutive pulses and sending a Kth pulse of the N consecutive pulses, and is enabled at a beginning of the Kth pulse of the N consecutive pulses; K is a positive integer greater than one and less than or equal to N; the time-of-flight is further configured to detect time of flight of a single pulse of the N consecutive pulses according to the sampling result, and measure a distance between the target object and a reference position according to the time of flight.

11. The distance measuring system of claim 10, wherein the predetermined sampling duration is longer than or equal to a pulse period of the single pulse of the N consecutive pulses.

12. The distance measuring system of claim 10, wherein the control circuit is configured to use a period of time, taken by the pulse generator unit to send the Kth pulse of the N consecutive pulses, as the predetermined sampling duration.

13. The distance measuring system of claim 10, wherein the time-of-flight sensor is configured to, within the predetermined sampling duration, sample the reflected signal once each time the predetermined sampling interval has elapsed.

14. The distance measuring system of claim 13, wherein the predetermined sampling interval is equal to 1/M of a pulse period of one of the N consecutive pulses, and M is a positive integer greater than one.

15. The distance measuring system of claim 10, wherein the N consecutive pulses are N consecutive light pulses; and the time-of-flight sensor comprises:
 a pixel array, comprising a plurality of pixels, wherein each of the pixels comprises:
 a light sensor, configured to sense the reflected signal to generate a photo response signal;
 a first photoelectric readout circuit configured to, within the predetermined sampling duration, be selectively coupled to the light sensor according to a first control signal generated from the control circuit and accordingly generate a first pixel output; and
 a second photoelectric readout circuit configured to, within the predetermined sampling duration, be selectively coupled to the light sensor according to a second control signal generated from the control circuit and accordingly generate a second pixel output, wherein the second control signal and the first control signal have different phases, and at least one of the first photoelectric readout circuit and the second photoelectric readout circuit is coupled to the light sensor within the predetermined sampling duration; and
 a processing circuit, coupled to the pixel array and the control circuit, the processing circuit being configured to refer to a sample control signal to sample the first pixel output and the second pixel output of each pixel each time the predetermined sampling interval has elapsed, and accordingly generate the sampling result according to the first pixel output and the second pixel output of each pixel.

16. The distance measuring system of claim 15, wherein the first photoelectric readout circuit is configured to, when coupled to the light sensor within the predetermined sampling duration, sample the photo response signal to generate the first pixel output; and the second photoelectric readout circuit is configured to, when coupled to the light sensor within the predetermined sampling duration, sample the photo response signal to generate the second pixel output.

17. The distance measuring system of claim 16, wherein the first photoelectric readout circuit is configured to, when uncoupled from the light sensor within the predetermined sampling duration, generate a first reference signal serving as the first pixel output; the second photoelectric readout circuit is configured to, when uncoupled from the light sensor within the predetermined sampling duration, generate a second reference signal serving as the second pixel output; and each time the first pixel output and the second pixel output are sampled, the processing circuit is configured to generate the sampling result by subtracting one of the first pixel output and the second pixel output from the other of the first pixel output and the second pixel output.

18. The distance measuring system of claim 10, wherein the first control signal and the second control signal have a phase difference of 180 degrees.

* * * * *